(12) United States Patent
Frantz et al.

(10) Patent No.: US 8,894,826 B2
(45) Date of Patent: Nov. 25, 2014

(54) COPPER INDIUM GALLIUM SELENIDE (CIGS) THIN FILMS WITH COMPOSITION CONTROLLED BY CO-SPUTTERING

(76) Inventors: Jesse A. Frantz, Landover, MD (US); Jasbinder S. Sanghera, Ashburn, VA (US); Robel Y. Bekele, Washington, DC (US); Vinh Q Nguyen, Fairfax, VA (US); Ishwar D. Aggarwal, Fairfax Station, VA (US); Allan J. Bruce, Scotch Plains, NJ (US); Michael Cyrus, Summit, NJ (US); Sergey V. Frolov, New Providence, NJ (US)

( * ) Notice: Subject to any disclaimer, the term of this patent is extended or adjusted under 35 U.S.C. 154(b) by 404 days.

(21) Appl. No.: 12/884,524

(22) Filed: Sep. 17, 2010

(65) Prior Publication Data

US 2011/0067757 A1    Mar. 24, 2011

Related U.S. Application Data

(60) Provisional application No. 61/245,400, filed on Sep. 24, 2009, provisional application No. 61/245,402, filed on Sep. 24, 2009.

(51) Int. Cl.
*C23C 14/00* (2006.01)
*C23C 14/32* (2006.01)
(Continued)

(52) U.S. Cl.
CPC ............ *C23C 14/0623* (2013.01); *H01L 31/18* (2013.01); *H01L 31/0368* (2013.01); *H01L 31/03923* (2013.01); *H01L 21/02568* (2013.01); *C23C 14/3464* (2013.01); *Y02E 10/541* (2013.01); *H01L 21/02631* (2013.01)
USPC ............ 204/192.26; 204/192.12; 204/192.25; 204/192.27; 204/192.28; 204/298.12; 204/298.13; 427/74; 427/76; 438/84; 438/85; 438/86; 438/95

(58) Field of Classification Search
CPC ............ C23C 14/0623; C23C 14/3464; H01L 21/02568; H01L 31/0368; H01L 31/18; H01L 21/02631; H01L 31/03046; H01L 31/1844; H01L 2924/0134
USPC ............. 204/192.26, 192.27, 192.28, 298.12, 204/298.13, 192.12, 192.25; 427/74, 76; 438/84, 85, 86, 95
See application file for complete search history.

(56) References Cited

U.S. PATENT DOCUMENTS 5,626,688 A * 5/1997 Probst et al. .................. 136/265
6,890,790 B2 * 5/2005 Li et al. ........................... 438/93

(Continued)

OTHER PUBLICATIONS

U.S. Appl. No. 12/884,586, filed Sep. 17, 2010, Vinh Q Nguyen et al.

(Continued)

*Primary Examiner* — Michael Band
(74) *Attorney, Agent, or Firm* — US Naval Research Laboratory; Rebecca L. Forman (57) ABSTRACT

A method and apparatus for forming a thin film of a copper indium gallium selenide (CIGS)-type material are disclosed. The method includes providing first and second targets in a common sputtering chamber. The first target includes a source of CIGS material, such as an approximately stoichiometric polycrystalline CIGS material, and the second target includes a chalcogen, such as selenium, sulfur, tellurium, or a combination of these elements. The second target provides an excess of chalcogen in the chamber. This can compensate, at least in part, for the loss of chalcogen from the CIGS-source in the first target, resulting in a thin film with a controlled stoichiometry which provides effective light absorption when used in a solar cell.

15 Claims, 6 Drawing Sheets

(51) Int. Cl.
*C25B 9/00* (2006.01)
*C25B 11/00* (2006.01)
*C25B 13/00* (2006.01)
*B05D 5/06* (2006.01)
*B05D 5/12* (2006.01)
*H01L 21/00* (2006.01)
*C23C 14/06* (2006.01)
*H01L 31/18* (2006.01)
*H01L 31/0368* (2006.01)
*H01L 31/0392* (2006.01)
*H01L 21/02* (2006.01)
*C23C 14/34* (2006.01)

(56) References Cited

U.S. PATENT DOCUMENTS

| | | | |
|---|---|---|---|
| 6,974,976 B2 * | 12/2005 | Hollars | 257/184 |
| 2009/0098717 A1 | 4/2009 | Li et al. | |
| 2009/0250722 A1 | 10/2009 | Bruce et al. | |
| 2010/0055826 A1 * | 3/2010 | Zhong et al. | 438/84 |
| 2010/0159633 A1 | 6/2010 | Lee et al. | |

OTHER PUBLICATIONS

I Repins, M. A. Contreras, B. Egaas, C. DeHart, J. Scharf, C. L. Perkins, B. To, R. Noufi, "19.9%-efficient ZnO/CdS/CuInGaSe2 solar cell with 81.2% fill factor," Progress in Photovoltaics: *Research and Appl.*, 16, 235-239 (2008).

M. A. Green, K. Emery, D. L. King, Y. Hishikawa, W. Warta, Prog. Photovolt. Res. Appl. 15, 35 (2007).

Report on the Basic Energy Sciences Workshop on Solar Energy Utilization, US Dept. of Energy, Apr. 18-21, 2005. http://www.sc.doe.gov/bes/reports/files/SEU_rpt.pdf (accessed Jul. 2008).

J. D. Beach, B. E. McCandless, Mater. Res. Bull. 32, 225 (2007).

M. A. Contreras, K. Ramanathan, J. AbuShama, F. Hasoon, D. L. Young, B. Egaas, and R. Noufi, Pro. Photovolt. Res. Appl. 13, 209-216 (2005).

J. R. Tuttle, M. A. Contreras, K. R. Ramanathan, S. E. Asher, B. Bhattacharya, T. A. Berens, J. Keane, R. Noufi, NREL/SNL Photovoltaics Program Review, Nov. 1996, in: C. E. Witt, M. Al-Jassim, J.M. Gee (Eds.), AIP Conference Proceedings 394. American Institute of Physics, Woodbury, NY, 1997, p. 83.

B. M. Basol, "Preparation techniques for thin film solar cell materials: processing perspectives," Jph. J. Appl. Phys. 32, 35 (1993).

E. Niemi and L. Stolt, "Characterization of CuInSe2 thin films by XPS," Surface and Interface Analysis 15, 422-426 (1990).

G. Norsworthy, C. R. Leidholm, A. Halani, V. K. Kapur, R. Roe, B. M. Basol, R. Matson, "CIS film growth by metallic ink coating and selenization," Solar Energy Materials & Solar Cells 60, 127-134 (2000).

D. B. Mitzi, M. Yuan, W. Liu, A. J. Kellock, S. J. Chey, V. Deline, and A. G. Schrott, "A high-efficiency solution-deposited thin-film photovoltaic device," Adv. Mater. 20, 3657-3662 (2008).

V. Probst, W. Stettet, W. Riedl, H. Vogt, M. Wendl, H. Calwer, S. Zweigart, K.-D. Ufert, H. Cerva, and F.H. Karg, "Rapid CIS-process for high efficiency PV-modules: development towards large area processing," *Thin Solid Films,* 387, 262-267 (2001).

M. Gloeckler, J.R. Sites, "Band-gap grading in Cu(In,Ga)Se$_2$ solar cells," Journal of Physics and Chemistry of Solids, 66, 1891-1894 (2005.

* cited by examiner

COPPER INDIUM GALLIUM SELENIDE (CIGS) THIN FILMS WITH COMPOSITION CONTROLLED BY CO-SPUTTERING

CROSS REFERENCE

This application claims the benefit of U.S. Provisional Application Ser. No. 61/245,400, filed Sep. 24, 2009, entitled Thin Film $Cu(In_{1-x}Ga_x)Se_2$ ($0 \leq x \leq 1$) with Composition Controlled by Co-Sputtering, by Jesse A Frantz, et al., and U.S. Provisional Application Ser. No. 61/245,402, filed Sep. 24, 2009, entitled Low Temperature and High Temperature Synthesis of High-Purity Bulk $Cu(In_{1-x}Ga_x)Se_2$ ($0 \leq x \leq 1$) Materials, by Vinh Q. Nguyen, et al., the disclosures of which are incorporated herein in their entireties, by reference.

Cross reference is made to copending application Ser. No. 12/884,586, filed contemporaneously herewith, entitled SYNTHESIS OF HIGH-PURITY BULK COPPER INDIUM GALLIUM SELENIDE MATERIALS, by Vinh Q. Nguyen, et al., the disclosure of which is incorporated herein by reference in its entirety.

BACKGROUND

The present exemplary embodiment relates to a method for forming a compound semiconductor thin-film. It finds particular application in conjunction with semiconductor thin-films suitable for use in photovoltaic solar cells and other devices, and will be described with particular reference thereto. However, it is to be appreciated that the present exemplary embodiment is also amenable to other like applications.

Photovoltaic devices represent one of the major sources of environmentally clean and renewable energy. They are frequently used to convert solar energy into electrical energy. Typically, a photovoltaic device is made of a semiconducting junction with p-type and n-type regions. The conversion efficiency of solar power into electricity of such devices is limited to a maximum of about 30%, since photon energy in excess of the semiconductor's bandgap is wasted as heat and photons with energies smaller than the bandgap do not generate electron-hole pairs. The commercialization of photovoltaic devices depends on technological advances that lead to higher efficiencies, lower cost, and stability of such devices.

The cost of electricity can be significantly reduced by using photovoltaic devices constructed from inexpensive thin-film semiconductors. Thin films of polycrystalline copper indium gallium selenide of the form $Cu(In_{1-x}Ga_x)Se_2$, $0 \leq x \leq 1$ (CIGS), have shown promise for applications in thin film photovoltaics. The band gaps of these materials range from approximately 1.1 to 1.7 eV (see, J. L. Shay and J. H. Wernick, "Ternary Chalcopyrite Semiconductors: Growth, Electronic Properties and Applications," Pergamon, N.Y. (1975)). This should allow efficient absorption of solar radiation. A solar cell with an efficiency of 19.9%, measured with AM1.5 illumination, has recently been demonstrated by Repins, et al. (I. Repins, et al., "19.9%-efficient ZnO/CdS/CuInGaSe$_2$ solar cell with 81.2% fill factor," Progress in Photovoltaics: Research and Appl., 16, 235-239 (2008)). See also, K. W. Mitchell, Proc. 9th E. C. Photovoltaic Solar Energy Conference, Freiburg, FRG, September 1989, p. 292. Kluwer, Dordecht (1989); M. A. Green, et al., Prog. Photovolt. Res. Appl. 15, 35 (2007); Report on the Basic Energy Sciences Workshop on Solar Energy Utilization, US Dept. of Energy, Apr. 18-21, 2005; J. D. Beach, B. E. McCandless, Mater. Res. Bull. 32, 225 (2007); and M. A. Contreras, et al., Pro. Photovolt. Res. Appl. 13, 209-216 (2005).

CIGS films have been vacuum deposited by several different methods. These include evaporation (see, Repins, et al.), two-stage processes utilizing evaporated or sputter deposited precursors followed by selenization in $H_2Se$ (see B. M. Basol, "Preparation techniques for thin film solar cell materials: processing perspectives," Jph. J. Appl. Phys. 32, 35 (1993); E. Niemi and L. Stolt, "Characterization of CuInSe$_2$ thin films by XPS," Surface and Interface Analysis 15, 422-426 (1990)), metallic ink coating (G. Norsworthy, et al., "CIS film growth by metallic ink coating and selenization," Solar Energy Materials & Solar Cells 60, 127-134 (2000)), and coating via soluble hydrazine-based precursors (D. B. Mitzi, et al., "A high-efficiency solution-deposited thin-film photovoltaic device," Adv. Mater. 20, 3657-3662 (2008)).

While such techniques have produced efficient devices in the laboratory, there remains a need for CIGS deposition technologies that are scalable to large-area devices for commercial applications. Techniques for sputter deposition of CIGS, for example, have included the costly and potentially hazardous step of further selenization in $H_2Se$ of the previously sputtered elements. Films made by sputtering directly from the CIGS compounds are Se-poor since selenium is lost in the vapor phase during film deposition (see, V. Probst, et al., "Rapid CIS-process for high efficiency PV-modules: development towards large area processing," Thin Solid Films, 387, 262-267 (2001)). Additionally, the morphology is very coarse. Conventional sputtered CIGS films are thus typically unsuitable for high efficiency photovoltaic devices.

REFERENCES

The following references, the disclosures of which are incorporated herein by reference in their entireties, are mentioned:

U.S. Pub. No. 2010/0159633, published Jun. 24, 2010, entitled METHOD OF MANUFACTURING PHOTOVOLTAIC DEVICE, by Byoung-Kyu Lee, et al., discloses a method of manufacturing a photovoltaic device using a Joule heating-induced crystallization method. The method includes: forming a first conductive pattern on a substrate; forming a photoelectric conversion layer on the substrate having the first conductive pattern; and crystallizing at least part of the photoelectric conversion layer by applying an electric field to the photoelectric conversion layer, wherein the photoelectric conversion layer includes a first amorphous semiconductor layer containing first impurities, a second intrinsic, amorphous semiconductor layer, and a third amorphous semiconductor layer containing second impurities.

U.S. Pub. No. 2009/0250722, published Oct. 8, 2009, entitled METHOD FOR FORMING A COMPOUND SEMICONDUCTOR THIN-FILM, by Allan James Bruce, et al. discloses a method for fabricating a thin film semiconductor device. The method includes providing a plurality of raw semiconductor materials. The raw semiconductor materials undergo a pre-reacting process to form a homogeneous compound semiconductor target material. The compound semiconductor target material is deposited onto a substrate to form a thin film having a composition substantially the same as a composition of the compound semiconductor target material.

BRIEF DESCRIPTION

In accordance with one aspect of the exemplary embodiment, a method for forming a film includes providing first and second targets in a common sputtering chamber, the first target including a source of CIGS material and the second target including a chalcogen. The method further includes sputtering the targets towards a substrate to provide a film comprising polycrystalline CIGS material on the substrate which incorporates chalcogen from the second target.

In accordance with another aspect of the exemplary embodiment, a sputtering apparatus includes a sputtering chamber. At least a first target is positioned in the chamber. The first target is energizable to sputter a source of a CIGS material towards a substrate. A second target is positioned in the chamber, which is energizable to sputter a chalcogen towards the substrate. By energizing the first and second targets, a layer of CIGS material is provided on the substrate, the layer incorporating, within the CIGS material polycrystalline structure, chalcogen from the second target.

In accordance with another aspect of the exemplary embodiment, a method for forming a solar cell includes sputtering first and second targets towards a substrate to provide a film comprising polycrystalline CIGS material on the substrate, the first target including a source of CIGS material having an oxygen concentration of less than 10 ppm and the second target including a chalcogen, the chalcogen in the second target being at a higher concentration than in the first target, and the second target also having oxygen concentration of less than 10 ppm by weight. First and second electrode layers are provided on the substrate. The electrode layers are spaced by the film.

DETAILED DESCRIPTION

Aspects of the exemplary embodiment relate to a method and an apparatus for preparing thin films of polycrystalline copper-indium-gallium-selenium (CIGS) material and related compounds consisting essentially of copper, group IIIA metal, chalcogen, and optionally one or more dopants, all of which will be referred to herein for convenience as CIGS materials. The exemplary method includes depositing a CIGS material, while providing an excess of selenium, or other chalcogen in a sputtering chamber, to compensate for loss of chalogen as vapor. The film of CIGS material produced by the method can thus comprise a CIGS material sputtered from a first target which incorporates, within its polycrystalline structure, chalcogen which has been sputtered from a second target.

The exemplary thin film can be wholly or partially made of a polycrystalline CIGS material which has the general formula $Cu(In_{1-x}Ga_x)M_y$, where $0 \leq x \leq 1$, M represents a chalcogen selected from selenium (Se), sulfur (S), tellurium (Te), and combinations thereof, and y is approximately 2. The indium/gallium can be partially substituted with Al. In one embodiment, the chalcogen in the CIGS material is at least predominantly Se (i.e., >50 atomic % Se), and can be at least 95 atomic % Se and up to 100 atomic % Se. While the chalcogen may be referred to herein as selenium, it is to be appreciated that the other chalcogens, S and Te, may alternatively or additionally be present in the thin film.

While the CIGS material in the film can be stoichiometric (y=2), it is also contemplated that the proportions of the elements may be varied from the exact stoichiometric amounts without loss of the integrity and homogeneous dispersion of the elements in the crystalline material. For example, Se can vary from 80-120% of its stoichiometric amount in the CIGS material. An approximately stoichiometric formula of the CIGS material can thus be represented by the general formula: $Cu_a(Z)M_y$, where Z is selected from In, Ga, Al, and combinations thereof, $0.8 \leq a \leq 1$, and $1.6 \leq y \leq +2.4$. In one embodiment, a=1 and y is approximately 2. The CIGS material in the film can contain dopants, such as one or more of Na, Li, Cr, and Ti. The dopant or dopants may each be at a concentration of from 0.001 to about 2 atomic % of the film. The total of all dopants in the film is less than 10 atomic %. The film may have a low oxygen concentration, e.g., 10 ppm or less, as measured by inert gas fusion with a LECO analyzer, available from LECO Corp., St. Joseph, Mich. In the exemplary embodiment, elements other than Cu, Al, In, Ga, and chalcogen account for no more than 10 atomic % of the film. The approximately stoichiometric CIGS materials in the film still have the CIGS crystalline structure, rather than different crystalline phases, but can have, for example, up to 1 in 5 vacancies, when copper is deficient, and/or occasional sites occupied by dopant atoms.

The composition of the polycrystalline film is controlled by co-sputtering from separate targets, a first target (CIGS target) comprising a CIGS source material, and a second target (chalcogen target), which is chalcogen rich, as compared to the first target, and can be a pure polycrystalline chalcogen. The CIGS source material may be a CIGS material, as described above and/or one or more precursors for forming a CIGS material. The chalcogen in the chalcogen target is selected from selenium, sulfur, tellurium, and combinations thereof. The combination of targets can provide a higher dose of chalcogen in the sputtering chamber than is obtained with a single CIGS target. As a consequence, the selenium or other chalcogen which would otherwise be lost from the CIGS source material in the vapor phase is compensated for by the chalcogen in the second target. The resulting thin film can thus be higher in chalcogen than it would be otherwise. By tailoring the compositions of targets and/or their relative sputtering rates to provide a higher than stoichiometric amount of chalcogen in the combined sputtered material, the deposited film may have a more nearly stoichiometric polycrystalline CIGS structure, with few crystal defects due to missing chalcogen atoms.

Figure 1:
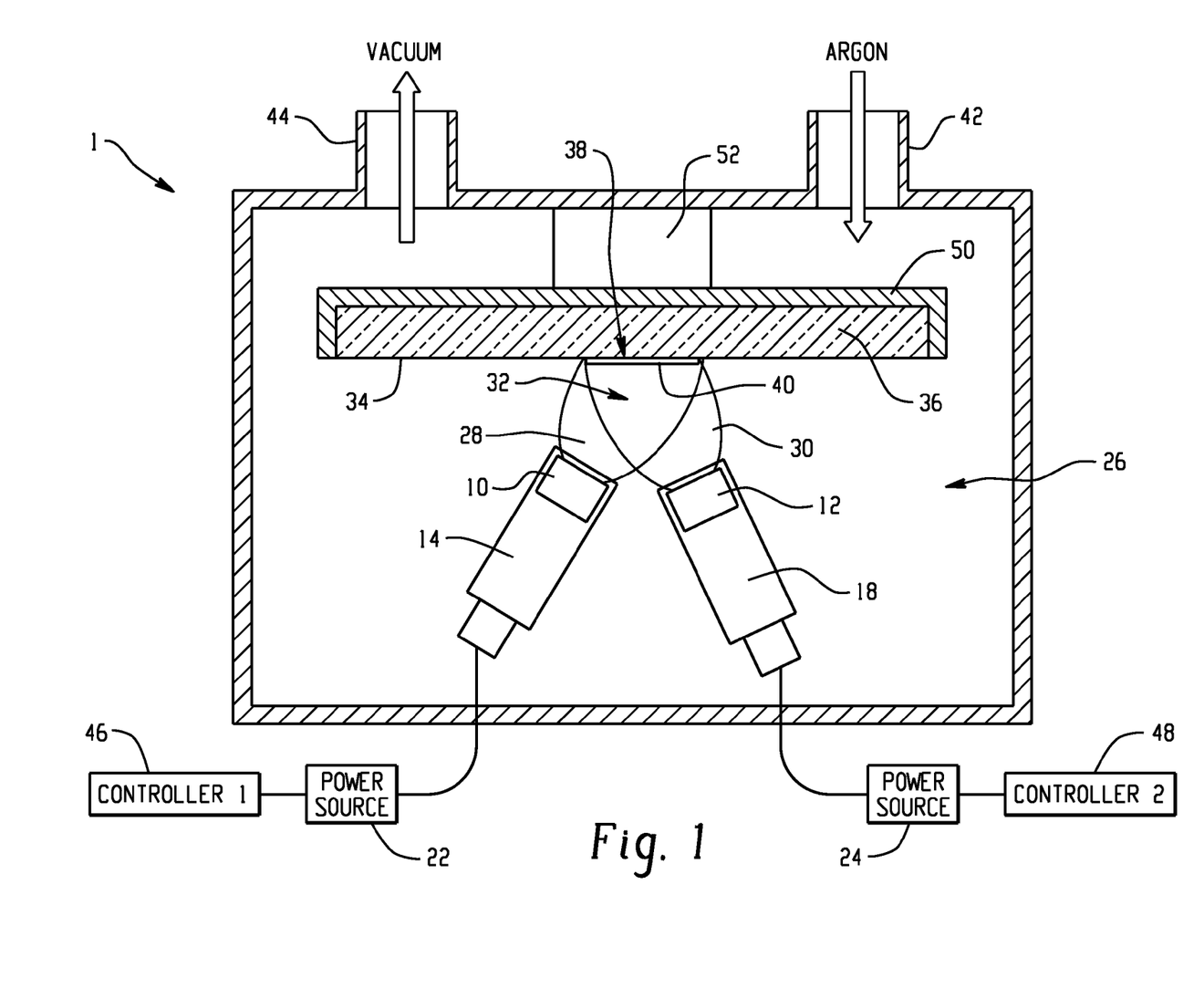
FIG. 1 is a schematic diagram of an co-sputtering apparatus in a configuration in accordance with one aspect of the exemplary embodiment.

A first embodiment of a co-sputtering apparatus 1 is illustrated in FIG. 1. The apparatus includes a first target 10 comprising a source of the CIGS material and a separate second target 12 comprising a chalcogen selected from selenium, sulfur, tellurium, and combinations thereof. The CIGS source material in target 10 can be a polycrystalline CIGS material as described above. The target 10 is mounted in a first sputter source 14 and the target 12 is mounted in a second sputter source 18.

The sputtering apparatus 1 may be configured for any suitable sputtering method, such as radiofrequency (RF), DC, or magnetron sputtering. For example, the targets 10, 12 may be powered by separate RF, AC, or DC power sources 22, 24, respectively. The power sources supply current to raise each target to a negative potential (cathode), causing material to be sputtered off into a surrounding plasma. An RF magnetron (not shown) or positive electrode may be positioned adjacent the target. The targets 10, 12 are arranged in a sputtering chamber 26 so that plumes 28, 30 of sputtered material are coincident in a region 32 of the chamber adjacent a surface 34 of a substrate 36. For example, the sputter sources are angled towards the same area 38 on the substrate surface 34, so that the plumes overlap in area 38. This results in the deposition of a thin layer film 40 (not to scale) of CIGS material. The chamber 26 is provided with an inlet 42 for introducing an inert sputtering gas, such as argon, at low pressure. The chamber is evacuated with a vacuum source (not shown) via an outlet 44. Walls of the chamber may be grounded.

One or both of the exemplary power sources 22, 24 is/are variably adjustable by respective controllers 46, 48 for variably adjusting the power to each of the target electrodes 10, 12. A ratio of energy (W/cm$^2$) supplied to the surfaces of first and second targets 10, 12 can be varied during the sputtering by variably controlling one or both power sources and/or by sputtering the two targets sequentially. In this way, the relative amounts of material sputtered from the targets may be adjusted during deposition of the film 40 to vary the concentration of the target materials in the film.

An electrically powered heater 50 variably adjusts the temperature of the substrate 36 to provide a suitable substrate surface temperature for deposition of CIGS material (e.g., at least about 250°, such as about 550° C.) and optionally to provide a suitable temperature for annealing the film 40 for a period of time (e.g., a temperature of about 400-600° C., or higher if the substrate melting temperature is higher). The substrate may be mounted for rotation on a substrate support 52. The support may be coupled to an RF power source, a DC power source, an AC power source, or to ground.

While FIG. 1 illustrates a sputter up configuration (targets positioned below the substrate), other configurations, such as sputter down, are also contemplated.

The exemplary method for forming the CIGS film 40 includes mounting targets 10, 12 and a substrate 36 in a common chamber 26. The chamber is flushed with argon, or other inert sputtering gas, and evacuated to a low argon pressure. Thereafter, while maintaining the chamber under vacuum with a slight argon gas pressure to provide argon gas flowing through the chamber, the method includes sputtering CIGS material from target 10 and sputtering chalcogen from target 12. The energy applied to the targets may be selected to provide an excess of chalcogen in the vapor. The energy applied to the targets can be different. For example, the energy applied in W/cm$^2$ is higher for target 10 than for target 12, e.g., at least two times that for target 12. The chalcogen in the vapor may be at least about 5 or 10 atomic % in excess of the CIGS stoichiometric amount, e.g., up to about 15%. By maintaining the substrate at a temperature above the melting point of selenium (219° C.), or other chalcogen, this excess does not contribute to deposition of a selenium phase. Rather, the film formed is polycrystalline CIGS.

The targets 10, 12 may be sputtered sequentially and/or contemporaneously during the formation of the film 40. In the case of sequential sputtering, the CIGS material in the film 40 may be formed by annealing, e.g., at about 400-600° C., sequentially-applied CIGS and chalcogen layers on the substrate at a sufficient temperature for the chalcogen to diffuse from the chalcogen layer(s) through the film to the CIGS layer(s) and react with the CIGS material to increase the stoichiometric amount of chalcogen in the polycrystalline CIGS material. One or more additional layers may be deposited over the thin film in the formation of a semiconductor device. The additional layer(s) may be formed in the same sputtering chamber or separately. The thin film 40 may be of any suitable thickness, which may depend on the application for which it is being used. For example, the thin film may be at least 5 nanometers in thickness and can be up to about 500 nm or more.

As will be appreciated, a purely stoichiometric CIGS film 40 is 50 atomic % chalcogen (e.g., 2 Se atoms to one each of Cu and Ga/In) and has a Ch:(Ch+Cu+Ga/In/Al) atomic ratio of 1:2, although this ratio may be modified slightly in the exemplary film by the presence of one or more dopants which occupy sites in the tetragonal crystalline structure or by permitting vacancies to occur.

In one exemplary embodiment target 10 is predominantly CIGS material (Ch+Cu+Ga/In/Al), e.g., at least 80 atomic % or at least 90 atomic % and can be up to 100 atomic % (Ch+Cu+Ga/In/Al). Expressed as atomic percent, the target 10 can be at least 20 atomic % Cu, at least 20 atomic % Ga/In/Al, and at least 40 atomic % Ch (Ch=chalcogen, i.e., Se, S, and/or Te). The Ch:(Ch+Cu+Ga/In/Al) atomic ratio in target 10 may be approximately 1:2, e.g., from 1:1.8 to 1:2.2, and in one embodiment, from 1:1.9 to 1:2.1. In the exemplary embodiment, the CIGS target 10 is up to about 50 atomic % chalcogen.

The second target 12 is chalcogen rich, relative to target 10, i.e., has a Ch:(Ch+Cu+Ga/In/Al) atomic ratio which is higher than in the first target. As a result of the excess chalcogen sputtered from target 12, the CIGS material in the film 40 has fewer crystal defects arising from absent chalcogen atoms. The Ch:(Ch+Cu+Ga/In/Al) atomic ratio in target 12 may be at least 1:1.6, e.g., at least 1:1.5, and can be up to 1:1. In the exemplary embodiment, the chalcogen target 12 is predominantly chalcogen, i.e., greater than 50 atomic % chalcogen, e.g., at least 60 atomic % chalcogen, and can be substantially pure chalcogen, e.g., at least 80 or 90 atomic % chalcogen, or pure chalcogen, e.g., at least 99 atomic % chalcogen, and can be up to 100 atomic % chalcogen. A ratio of chalcogen in the second target 12 to chalcogen in the first target 10 may be at least 1.1:1, e.g., at least 1.2:1 and in some embodiments is at least 1.5:1 or at least 1.8:1 and can be up to about 2:1. Both targets 10, 12 may have an oxygen concentration of less than 10 ppm, by weight.

In some embodiments, the target 12 may include other materials, such as dopants, e.g., Na, Li, Cr, Ni, Ti, or a combination thereof. The dopants may be present, for example, at a total of up to 40 or 50 atomic % of the chalcogen target 12 to provide dopant in the film 40 at up to 10 atomic % in total. In other embodiments, the dopant(s) may be co-sputtered from target 10 and/or a separate target.

Sputtering from two targets 10, 12 with different chalcogen concentrations allows the ratios of the different constituents of the layer 40 to be varied. This can be controlled by adjusting the electrical power applied to the respective targets. For example, these can be tuned so that the resulting film 10 is closer to the stoichiometric amounts of the CIGS constituents. Additionally, or alternatively, the composition of the film 40 can be varied with depth through the film's thickness by varying the power/controlling the relative power applied to each target during deposition. This method can be applied, for example, to create a film with a tailored bandgap. For example, one region of the film may have a first Ch:(Ch+Cu+Ga/In/Al) atomic ratio and a second region at a different depth may have a second Ch:(Ch+Cu+Ga/In/Al) atomic ratio which is at least 5% or at least 10% greater or less than the first ratio.

Figure 2:
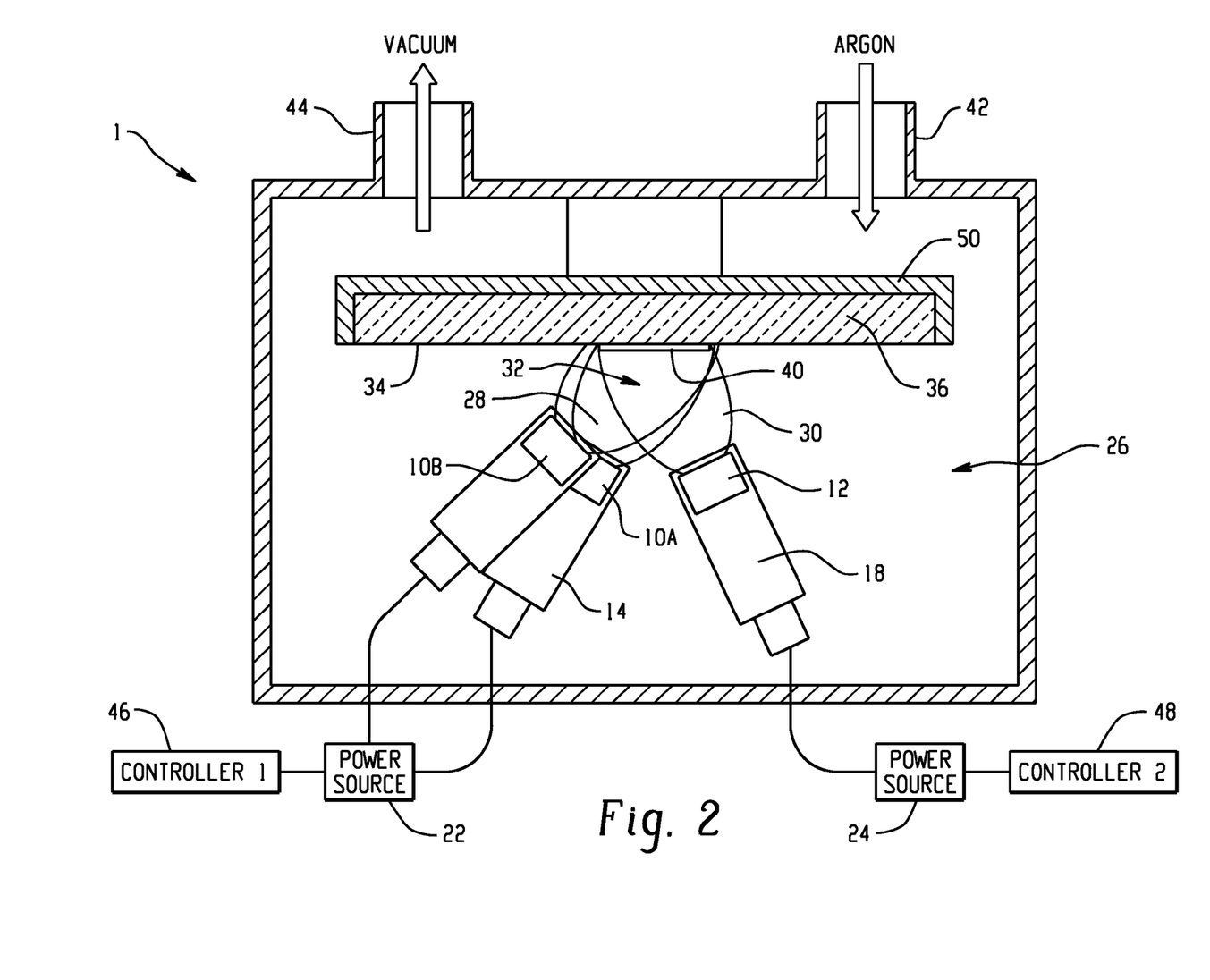
FIG. 2 is a schematic diagram of an co-sputtering apparatus in a configuration in accordance with another aspect of the exemplary embodiment.

While the co-sputtering can be performed with a single CIGS target 10 and a single chalcogen target 12, in another embodiment, two (or more) CIGS targets 10A, 10B are provided, as illustrated in FIG. 2. Each CIGS target 10A, 10B has a different CIGS stoichiometry. The two targets may be sputtered using the same or separate power sources and controllers.

In one embodiment, a first CIGS target 10A may have a first value of x and a second CIGS target 10B may have a second value of x different from the first target. As an example, first CIGS target 10A may be formed from $CuInSe_2$ (x=0) and second CIGS target 10B is formed from $CuGaSe_2$ (x=1). The In/Ga ratio in the deposited film may be controlled by adjusting the relative power to the respective sputtering guns.

In another embodiment, one target 10A may be formed from a CIGS compound comprising a first chalcogen, while the second target 10B uses a second chalcogen. As an example, first CIGS target 10A may be formed from $CuInSe_2$ and second CIGS target 10B is formed from $CuInTe_2$.

In another embodiment, one target 10A may be formed from a CIGS compound comprising a first value of x and first chalcogen, while the second target 10B uses a second value of x and a second chalcogen. As an example, first CIGS target 10A may be formed from $CuInSe_2$ and second CIGS target 10B is formed from $CuGaTe_2$.

In another embodiment, the targets 10A and 10B each comprise a respective CIGS precursor, which when combined, form the exemplary CIGS material. Co-sputtering from compounds that each form a subset of CIGS compounds may be used (e.g., $CuSe_2$, $In_2Se_3$, $Ga_2Se_3$). As an example, first CIGS target 10A may be formed from $CuSe_2$, and second CIGS target 10B is formed from one or more of $In_2Se_3$ and $Ga_2Se_3$. As will be appreciated, three targets for $CuSe_2$, $In_2Se_3$ and $Ga_2Se_3$ could be used, or various combinations of precursors used in different targets to arrive at a desired value of x or selected ratio of chalcogens. For example, in a two target system as shown in FIG. 1, one target may include at least one of $CuSe_2$, $In_2Se_3$ and $Ga_2Se_3$ with selenium and the other target may include at least the others of $CuSe_2$, $In_2Se_3$ and $Ga_2Se_3$.

In other embodiments, a dopant such as Na, Li, Cr, Ni, or Ti is added to the film by co-sputtering from a target consisting of the dopant or of a compound containing the dopant.

Sputtering from two or more CIGS targets 10A, 10B with different stoichiometries allows the ratio of different constituents of the layer to be varied by adjusting the electrical power applied to the respective CIGS targets. Additionally, the composition of the film can be varied with depth through the film's thickness by varying the power/controlling the relative power applied to each target during deposition. This method can be applied, for example, to create a film with a tailored bandgap.

As will be appreciated, the exemplary method is not limited to two or three targets. For example, as many as six sputtering targets may be used for simultaneous deposition.

Figure 3:
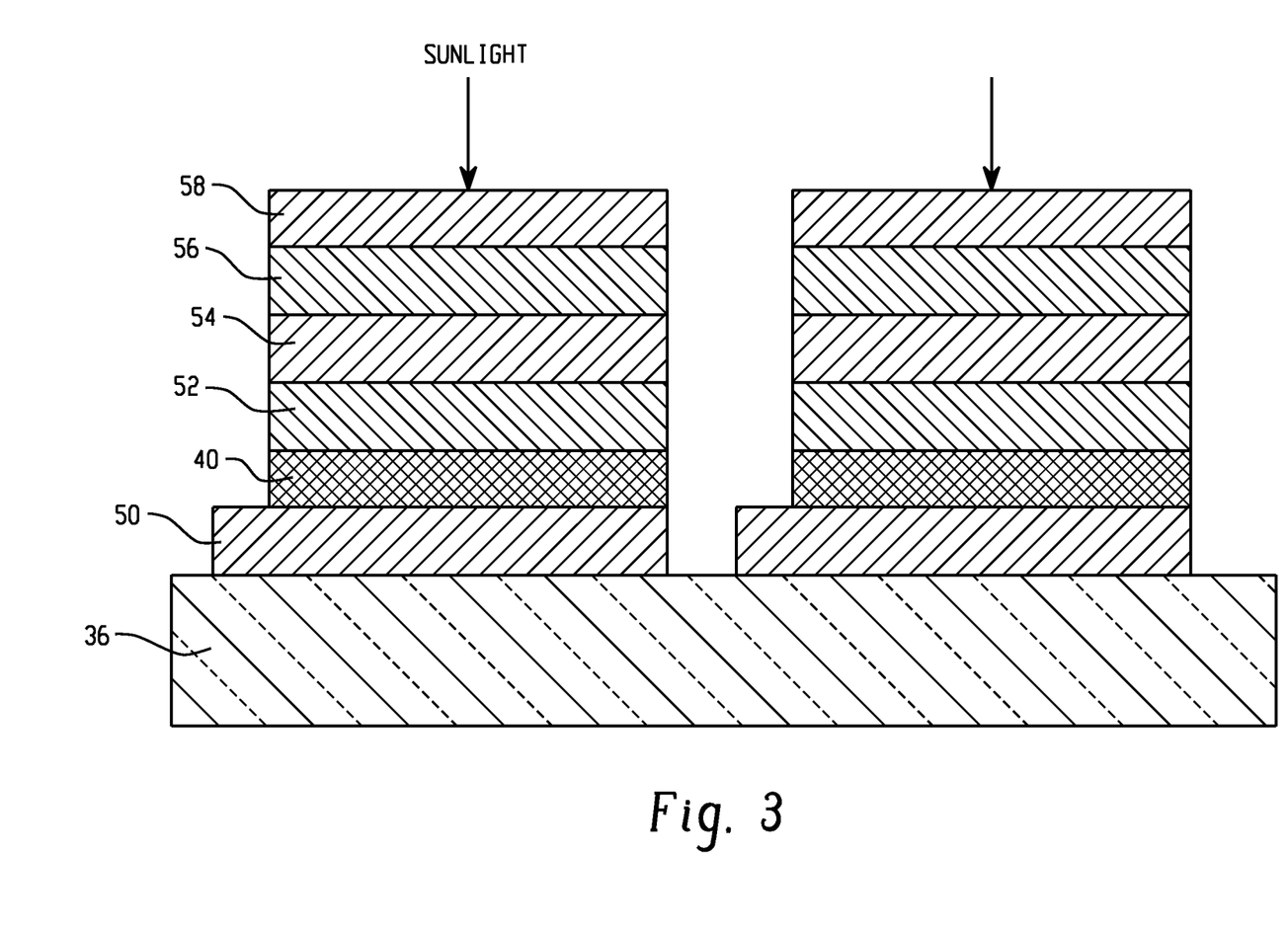
FIG. 3 is a schematic cross sectional diagram of a thin film semiconductor device in accordance with another aspect of the exemplary embodiment.

The substrate 36 can be formed from any suitable material, such as glass, metal foil, plastic or the like. The substrate 36 may have one or more intermediate layers deposited on it prior to layer 40. By way of example, FIG. 3 shows a semiconductor thin-film solar cell having a multilayer structure superposed on a substrate 36 in the following order, a back electrode 50, the exemplary thin film 40 as a light absorbing layer, an interfacial buffer layer 52, a window layer or layers 54, 56 and an upper electrode 58. The substrate 36 may be, for example, soda-lime glass, metal ribbon, or polyimide sheet and may be about 1-100 mm thick. The back electrode 50 may be a molybdenum metal film and may be about 0.5-10 μm thick. The thin film 40 may be about 500 nm-3 μm thick. The interfacial buffer layer 52 may be formed from cadmium sulfide, and may be about 10-100 nm thick. The window layer 54, 56 may be formed from zinc oxide and indium tin oxide and may be about 0.1-1 μm thick. If the window layer 54, 56 is formed from zinc oxide, part or all of the films thickness may be doped with about 0.5-5 weight percent aluminum. The upper electrode 58 may be a grid with a maximum thickness of about 0.5-10 μm.

To form such a structure, a substrate 36 is sputter coated with molybdenum, forming the back electrode 50. Then the CIGS absorption layer 40 is deposited over the back by sputtering, as described above. Next, a chemical bath is applied to deposit cadmium sulfide 52, forming a heterojunction with the adsorption layer 40. Then, zinc oxide and indium tin oxide are sputter coated on to form a clear window 54, 56. The grid 58 is e-beam-evaporated on top. As will be appreciated, the structure may include fewer, additional, or different layers from those described.

One advantage of the exemplary embodiment is that the exemplary deposition method can eliminate the need for post-deposition selenization and/or annealing because the desired composition can be created during co-sputtering. As a result of the elimination of post-deposition selenization and/or annealing, the proposed method enables the deposition of the composition on substrates that cannot tolerate high temperatures, such as plastics.

Another advantage is that the sputtering targets can be independently controlled to create either multilayered or codeposited films. As an example, a layer of only Se can be deposited, followed by a layer of other materials. This process can be repeated several times.

The sputtering targets can be formed, for example, by hot pressing or direct melting in a quartz ampoule or a crucible. For example, the exemplary targets 10, 10A, and 10B can be formed by the method described in above-mentioned co-pending application Ser. No. 12/884,586, entitled SYNTHESIS OF HIGH-PURITY BULK COPPER INDIUM GALLIUM SELENIDE MATERIALS, by Vinh Q. Nguyen, et al., incorporated herein by reference. In particular, high purity elements for forming the CIGS source 10, such as elemental selenium, gallium, indium, and copper, are reacted together, optionally in the presence of one or more dopants. Some or all of the elemental materials used may be pretreated to reduce the concentration of oxygen, e.g., by heating at a temperature above the melting point in a stream of hydrogen gas and/or by distillation. The materials are combined in appropriate amounts in a reaction vessel which is evacuated and sealed before heating the vessel in a furnace to a desired reaction temperature, e.g., about 980-1100° C. Upon cooling of the reaction vessel, which can take place in the furnace or removed from it, the target 10 is formed as a crystalline monolith. The reaction vessel can have an interior shape which is the same as that of the desired target. For example, the vessel can have an interior width (e.g., diameter), of about 5-15 cm. The vessel may be formed from a frangible, refractory material, such as fused silica (quartz), which allows the cooled vessel to be broken open to release the already-formed target. The targets 10, 10A, and 10B themselves, as well as CIGS films formed by the present method using such a target or targets, can have a low oxygen concentration, e.g., about 10 ppm, or less.

Other methods for forming the sputtering targets are contemplated. For example, the crystalline CIGS material formed in the reaction vessel is broken up and compressed into a puck having the shape of the target. However, grinding of the CIGS material and forming it into a target can introduce more oxygen, which is generally undesirable in the film.

A chalcogen target 12 can be formed in a similar way, e.g., by heating the chalcogen, optionally with dopants, in a target-shaped vessel. The target shape is obtained on quenching of the melt. Optionally, a subsequent heat treatment is applied to control the degree of crystallinity and grain size.

Without intending to limit the scope of the exemplary embodiment, the following examples describe co-sputtering of films.

EXAMPLES

Example 1

High-purity bulk CIGS material is formed in a silica ampoule. The bulk material is ground into a fine powder and hot pressed into a puck. The puck is machined into an approximately 7.6 cm diameter, 0.3 cm thick sputtering target. A commercial Se target is arc melted and cast, then machined to its final dimensions.

Deposition is carried out by RF magnetron sputtering in a sputter-up geometry onto a substrate, as illustrated in FIG. 1. The sputtering process is carried out in an Ar atmosphere with a pressure of 5 milliTorr and an Ar flow rate of 15 sccm. A first target 10 is $CuIn_{0.7}Ga_{0.3}Se_2$. For this target, an energy density of approximately 2 W/cm$^2$ is used. A second target 12 is pure polycrystalline Se. For this target, an energy density of approximately 0.7 W/cm$^2$ is used.

A molybdenum-coated soda lime glass substrate is used. The molybdenum layer simulated the bottom contact in a photovoltaic device. The substrate is positioned approximately 15 cm above the surfaces of the targets 10, 12 and is rotated at a rate of approximately 15 rpm during deposition. The substrate is heated to a temperature of 400° C. Deposition is carried out for 12.5 hours. In other examples, the temperature is modified from 100 to 550° C.

The resulting films are approximately 1.5 µm thick, but can be thicker depending on choice of processing conditions and time.

Figure 4:
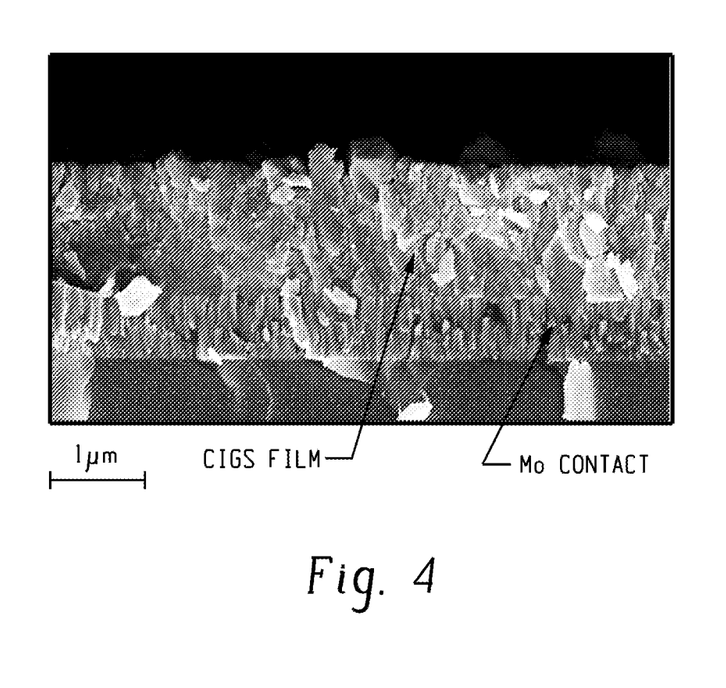
FIG. 4 is an SEM image of a thin film obtained by sputtering CIGS without co-sputtering of selenium.
Figure 5:
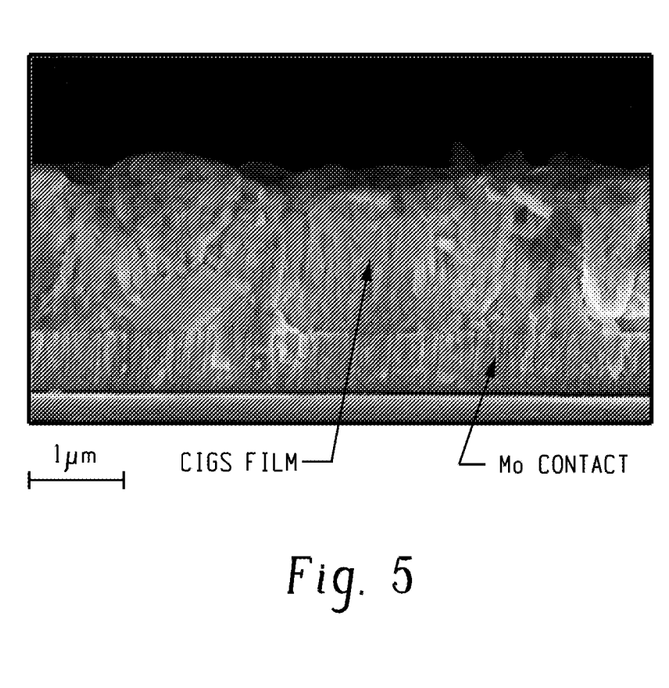
FIG. 5 is an SEM image of a thin film obtained by sputtering CIGS with co-sputtering of selenium.

FIGS. 4 and 5 show SEM cross sections of films made without (FIG. 4) and with (FIG. 5) co-sputtering Se but with otherwise identical deposition parameters. As can be seen in the images, the films co-sputtered with Se exhibit distinct morphological differences compared to the films deposited without it. In particular, the film is denser and has fewer voids.

Example 2

Figure 6:
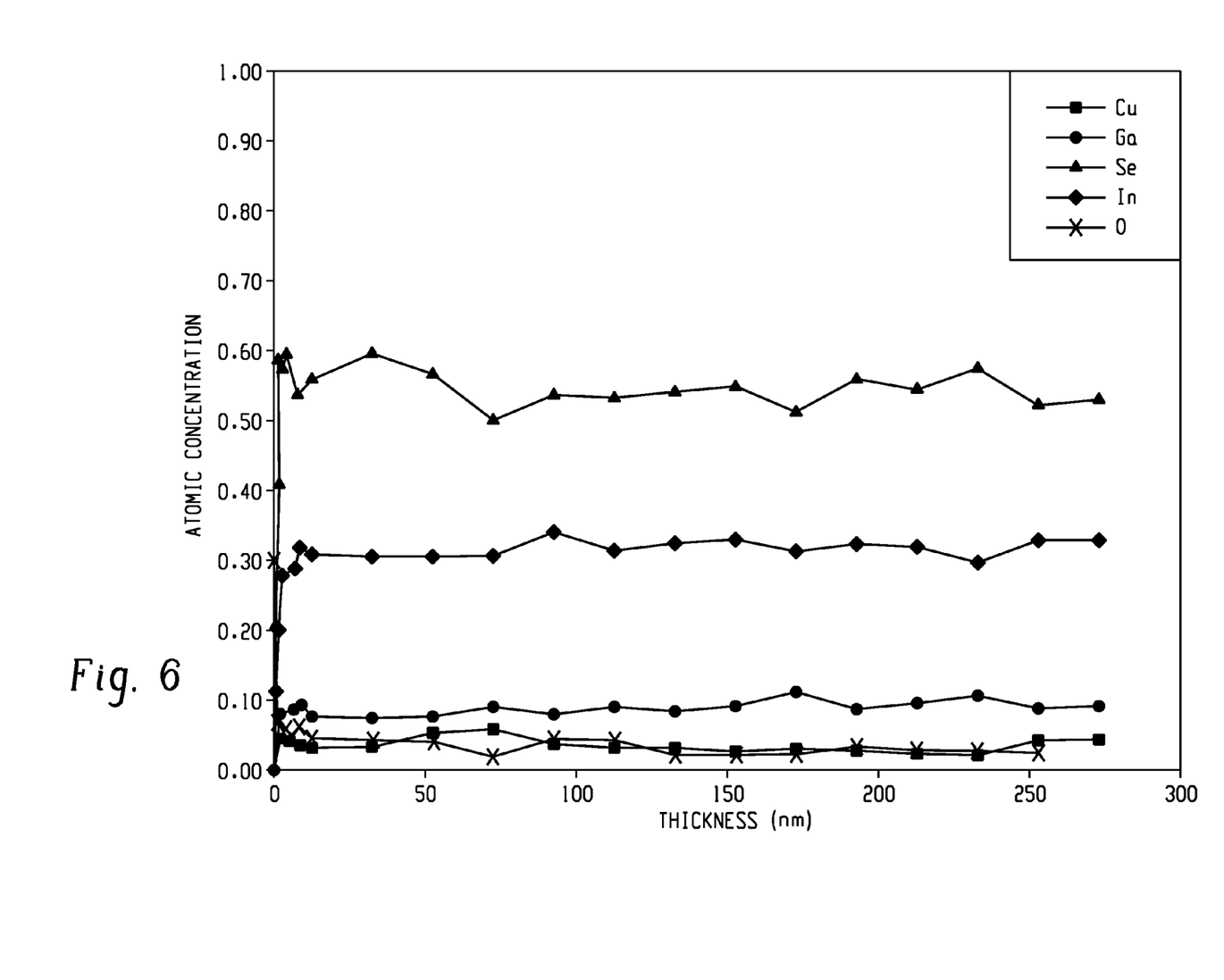
FIG. 6 is an XPS plot illustrating concentrations with depth through the exemplary film obtained by maintaining a constant power through a selenium target and a CIGS target.
Figure 7:
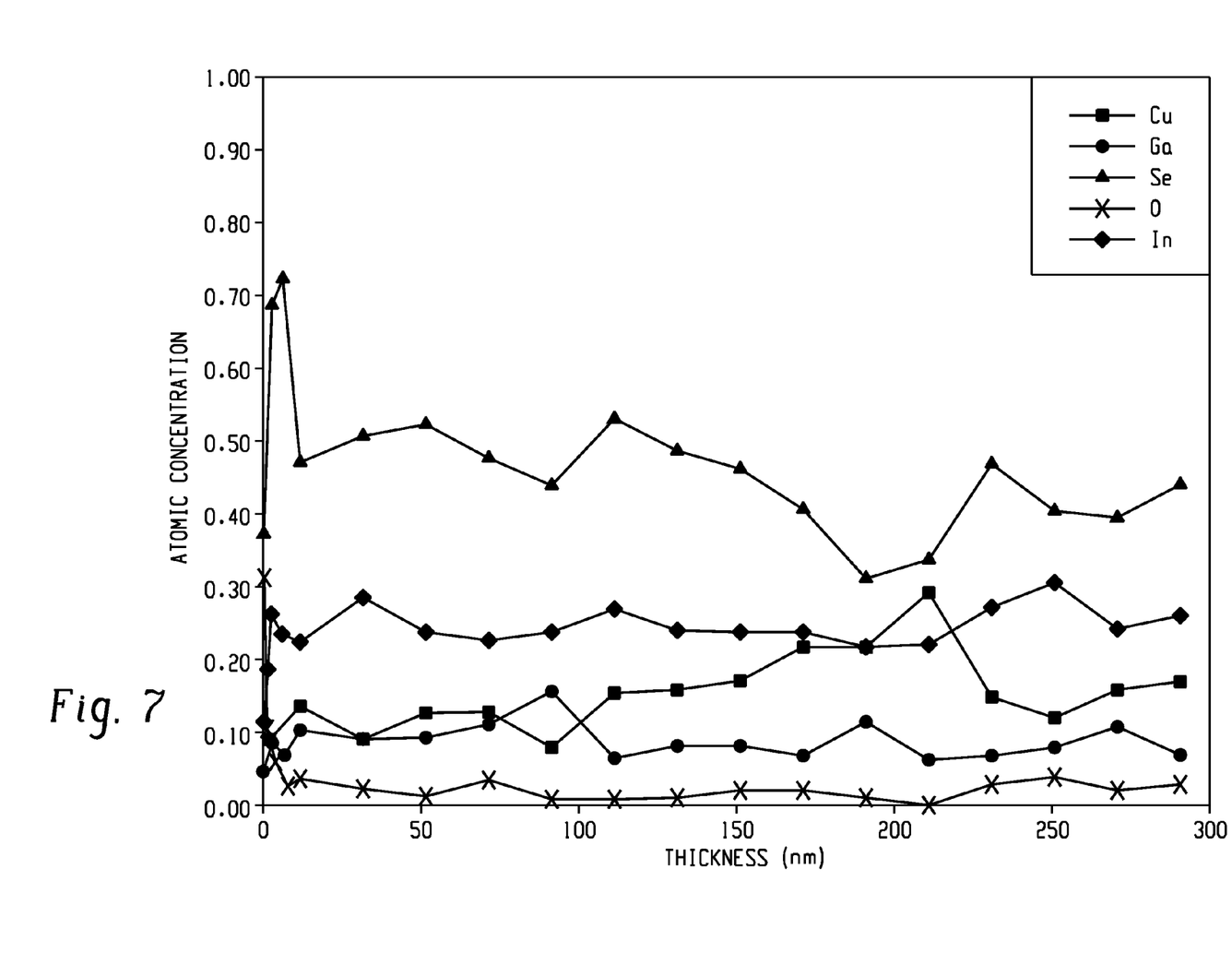
FIG. 7 is an XPS plot illustrating concentrations with depth through the exemplary film obtained by maintaining a constant power through a CIGS target while varying power to a selenium target.

Films were formed as for Example 1 by a) keeping power to the targets constant at an energy density of approximately 2 W/cm$^2$ for the CIGS target 10 and an energy density of approximately 0.7 W/cm$^2$ for the Se target 12 throughout deposition and b) varying the power. For the CIGS target 10 a constant energy density of approximately 2 W/cm$^2$ was used. For the Se target 12 the energy density was varied between 0 and 0.7 W/cm$^2$. FIGS. 6 and 7 show the atomic concentrations through a cross section of each film, determined by XPS. As can be seen from FIG. 6, a relatively homogeneous film is formed when the power ratio is constant. The atomic concentrations can be varied through the film (FIG. 7) when the power is varied.

As will be appreciated, the oxygen content of the film can be reduced over that shown in FIGS. 6 and 7 by using a bulk polycrystalline CIGS target and a purified selenium target, as described in copending application Ser. No. 12/884,586.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. A method for forming a film comprising:
providing first and second targets in a common sputtering chamber, the first target comprising a Cu—In—Ga—Se alloy and the second target comprising a chalcogen;
co-sputtering the first and second targets towards a substrate to form a film comprising polycrystalline CIGS material on the substrate which incorporates chalcogen from the second target.

2. The method of claim 1, wherein the chalcogen is selected from selenium, sulfur, tellurium, and combinations thereof.

3. The method of claim 2, wherein the chalcogen in the second target is predominantly selenium.

4. The method of claim 1, wherein the second target has a higher concentration of chalcogen than the first target.

5. The method of claim 1, wherein the second target comprises at least 60 atomic % chalcogen.

6. The method of claim 1, wherein at least one of the first and second targets includes a dopant.

7. The method of claim 6, wherein the dopant is selected from sodium, lithium, chromium, nickel, titanium and combinations thereof.

8. The method of claim 1, wherein the polycrystalline CIGS material has the general formula: $Cu_a(Z)M_y$, where Z comprises a combination of In and Ga or a combination of In, Ga and Al; M comprises Se, a combination of Se and S, a combination of Se and Te, or a combination of Se, S, and Te; $0.8 \leq a \leq 1$; and $1.6 \leq y \leq 2.4$.

9. The method of claim 1, wherein the first target has an oxygen concentration of less than 10 ppm.

10. The method of claim 1, wherein the sputtering comprises supplying energy to the first and second targets at a ratio which provides an amount of the chalcogen in the chamber which is in excess of a stoichiometric amount of the chalcogen in the polycrystalline CIGS material.

11. The method of claim 1, further comprising, during the sputtering, maintaining the substrate at a temperature in excess of a melting point of the chalcogen.

12. The method of claim 1, further comprising providing a third target in the sputtering chamber, the third target comprising a CIGS material different from the Cu—In—Ga—Se alloy in the first target, the method including sputtering from the third target towards the substrate.

13. The method of claim 1, wherein the sputtering from the first and second targets provides a film which has a higher chalcogen concentration than is achievable when only the first target is sputtered.

14. The method of claim 1, wherein the method includes varying a ratio of energy supplied to the first and second targets during the sputtering resulting in a varying film stoichiometry with depth.

15. The method of claim 1, further comprising:
forming a solar cell comprising the thin film.

* * * * *

UNITED STATES PATENT AND TRADEMARK OFFICE
CERTIFICATE OF CORRECTION

PATENT NO. : 8,894,826 B2
APPLICATION NO. : 12/884524
DATED : November 25, 2014
INVENTOR(S) : Jesse A. Frantz et al.

It is certified that error appears in the above-identified patent and that said Letters Patent is hereby corrected as shown below:

On the title page, please change item (76) to read item (75).

On the title page, item (73) The Assignees should be THE GOVERNMENT OF THE UNITED STATES, AS REPRESENTED BY THE SECRETARY OF THE NAVY and SUNLIGHT PHOTONICS INC.

Signed and Sealed this
Third Day of November, 2015

Michelle K. Lee
*Director of the United States Patent and Trademark Office*